(12) United States Patent
Breuer et al.

(10) Patent No.: US 11,817,292 B2
(45) Date of Patent: Nov. 14, 2023

(54) PRIMARY CHARGED PARTICLE BEAM CURRENT MEASUREMENT

(71) Applicant: ICT Integrated Circuit Testing Gesellschaft für Halbleiterprüftechnik mbH, Heimstetten (DE)

(72) Inventors: John Breuer, Munich (DE); Christian Droese, Munich (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 526 days.

(21) Appl. No.: 17/138,326

(22) Filed: Dec. 30, 2020

(65) Prior Publication Data

US 2022/0208509 A1    Jun. 30, 2022

(51) Int. Cl.
*H01J 37/244*    (2006.01)
*H01J 37/147*    (2006.01)

(52) U.S. Cl.
CPC ........ *H01J 37/244* (2013.01); *H01J 37/1472* (2013.01); *H01J 2237/2448* (2013.01); *H01J 2237/24475* (2013.01); *H01J 2237/24564* (2013.01)

(58) Field of Classification Search
CPC ............. H01J 37/244; H01J 37/1472; H01J 2237/24475; H01J 2237/2448; H01J 2237/24564; H01J 2237/24535
See application file for complete search history.

(56) References Cited

U.S. PATENT DOCUMENTS

| | | | |
|---|---|---|---|
| 4,101,771 A | 7/1978 | Hofer et al. | |
| 4,398,080 A | 8/1983 | Eloy et al. | |
| 2013/0187057 A1 | 7/2013 | Kobayashi et al. | |
| 2014/0117233 A1* | 5/2014 | Tuggle | H01J 37/244 250/397 |
| 2015/0076350 A1* | 3/2015 | Plettner | H01J 37/304 250/336.1 |
| 2015/0364296 A1 | 12/2015 | Nomaguchi et al. | |
| 2016/0284505 A1 | 9/2016 | Ren et al. | |
| 2018/0114672 A1 | 4/2018 | Ogawa et al. | |

FOREIGN PATENT DOCUMENTS

| | | |
|---|---|---|
| CN | 102543639 A | 7/2012 |
| DE | 25 34 796 A1 | 2/1977 |
| JP | H04-060487 A | 2/1992 |
| TW | 201419362 A | 5/2014 |
| TW | 201618151 A | 5/2016 |

OTHER PUBLICATIONS

International Search Report and Written Opinion for Application No. PCT/EP2013/084013, dated Feb. 25, 2022, 13 pages.

\* cited by examiner

*Primary Examiner* — Kiho Kim
(74) *Attorney, Agent, or Firm* — Kilpatrick Townsend & Stockton LLP

(57) ABSTRACT

It is provided a current measurement module 100 for measuring a current of a primary charged particle beam 123 of a charged particle beam device, the current measurement module 100 including a detection unit 160 configured for detecting secondary and/or backscattered charged particles 127 released on impingement of the primary charged particle beam 123 on a conductive surface 142 of a beam dump 140 of the charged particle beam device.

15 Claims, 4 Drawing Sheets

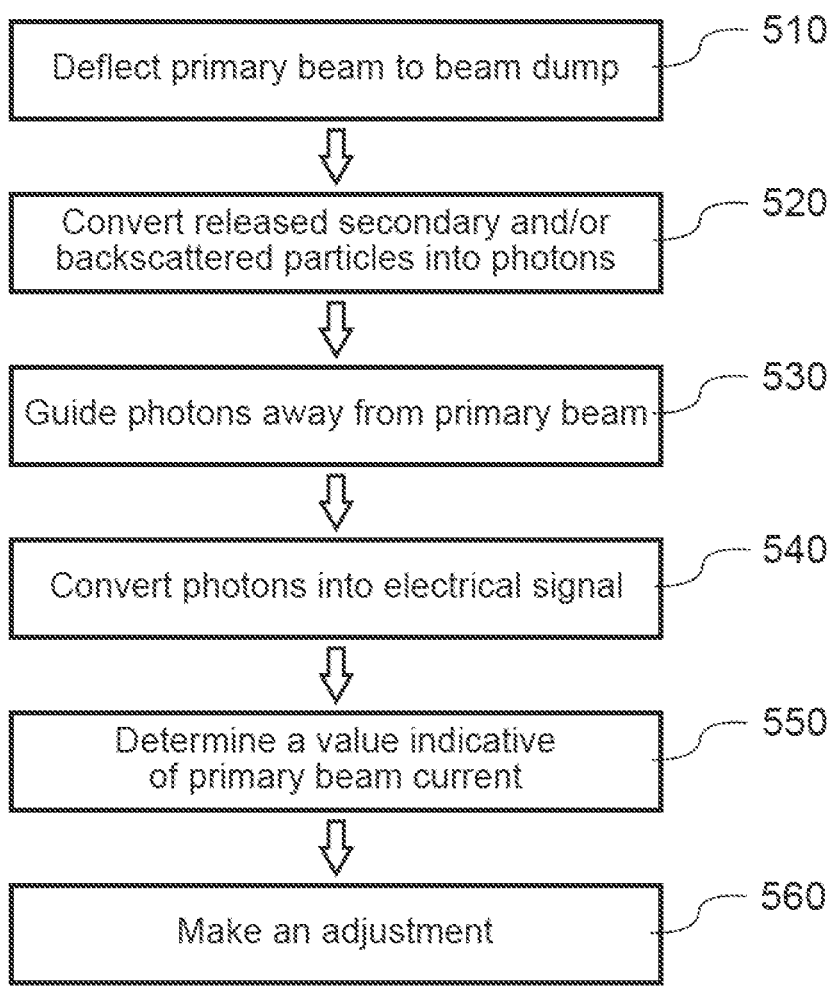

PRIMARY CHARGED PARTICLE BEAM CURRENT MEASUREMENT

FIELD

This disclosure generally relates to a current measurement module and a method of measuring a current of a primary charged particle beam. In particular, it relates to a current measurement module for measuring a current of a primary measurement charged particle beam of a charged particle beam device, such as a scanning electron microscope, and a method of measuring a current of a primary charged particle beam of a charged particle beam device.

BACKGROUND

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Charged particle beams offer superior spatial resolution compared to, e.g. photon beams, due to their short wavelengths. Accordingly, micrometer and nanometer scale process control, inspection or structuring is often done with charged particle beams, e.g. electron beams, which are generated and focused in charged particle beam devices, such as electron microscopes or electron beam pattern generators.

Charged particle beam devices, in particular systems for accurate measurements like CD measurement systems in chip industry, EDX in material analysis, or the like, have a desire for a defined beam current. Quantitative measurements beneficially have a stable beam current. Standard systems use a Faraday cup connected to an electrometer in order to measure the beam current on a regular basis.

Accordingly, during periodic maintenance, e.g., on a daily basis, the beam current is measured and readjusted to a predetermined value. This process is time-consuming and not ideal if the operation of the charged particle beam device should not be interrupted for a long time or if the beam current measurement should be conducted more frequently. Particularly for cold field emitters, current noise, current jumps and current drifts may occur on a comparably short time scale.

Accordingly, there is a challenge of improving current measurement devices and methods.

SUMMARY

In light of the above, it is provided a current measurement module for measuring a current of a primary charged particle beam of a charged particle beam device and a method of measuring a current of a primary charged particle beam of a charged particle beam device.

According to an aspect, a current measurement module for measuring a current of a primary charged particle beam of a charged particle beam device is provided. The current measurement module includes a detection unit configured for detecting secondary and/or backscattered charged particles released on impingement of the primary charged particle beam on a conductive surface of a beam dump of the charged particle beam device.

According to a further aspect, a method of measuring a current of a primary charged particle beam of a charged particle beam device is provided. The method includes detecting secondary and/or backscattered charged particles released upon impingement of the primary charged particle beam on a conductive surface of a beam dump of the charged particle beam device.

Further advantages, features, aspects and details that can be combined with the above embodiments are evident from the dependent claims, the description and the drawings.

Embodiments are also directed to apparatuses for carrying out the disclosed methods and including apparatus parts for performing each described method step. These method steps may be performed by way of hardware components, a computer programmed by appropriate software, by any combination of the two or in any other manner. Furthermore, embodiments are also directed to methods by which the described apparatus operates. It includes method steps for carrying out each function of the apparatus or manufacturing each part of the apparatus.

BRIEF DESCRIPTION OF THE DRAWINGS

Some of the above indicated and other more detailed aspects of the invention will be described in the following description and partially illustrated with reference to the figures. Therein:

FIG. 4 is a schematic drawing illustrating a method of measuring a current of a primary charged particle beam according to embodiments described herein; and FIG. 5 is a schematic drawing illustrating a method of measuring a current of a primary charged particle beam according to embodiments described herein.

DETAILED DESCRIPTION

Reference will now be made in detail to the various embodiments, one or more examples of which are illustrated in each figure. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations. Within the following description of the figures, the same reference numbers refer to the same or to similar components.

Without limiting the scope of the present application, the charged particle beam device or components thereof may, in the following, exemplarily be referred to as an electron beam device or components thereof. The electron beam might especially be utilized for inspection or lithography. Embodiments of the present invention can still be applied for apparatuses and components using other sources of charged particles and/or other secondary and/or backscattered charged particles to obtain a specimen image or to pattern a specimen.

Figure 1:
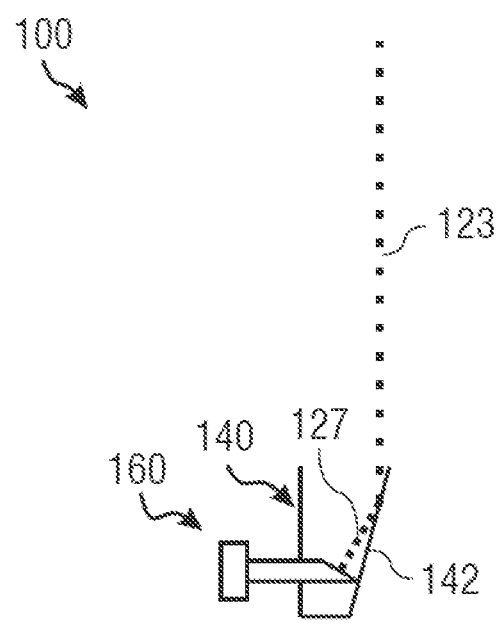
FIG. 1 is a schematic drawing illustrating a current measurement module according to embodiments described herein.

Components of an embodiment are described with reference to FIG. 1. FIG. 1 shows a current measurement module 100. According to the embodiment shown in FIG. 1, the current measurement module 100 includes a detection unit 160 configured for detecting secondary and/or backscattered charged particles 127 released on impingement of the primary charged particle beam 123 on a conductive surface 142 of a beam dump 140.

According to embodiments, the primary charged particle beam 123 is directed to a beam dump 140 during a time when the primary charged particle beam 123 is to be blanked, during a time when the primary charged particle beam 123 is to be temporarily interrupted, and/or during a scan e.g. between frames or lines.

Beneficially, the current of the primary charged particle beam can be determined or monitored without requiring dedicated maintenance time. Beneficially, probe current noise, jump, and/or drifts of the charged particle beam source, which are difficult to ultimately address by solutions such as vacuum and tip processing, can be effectively addressed.

Figure 2:
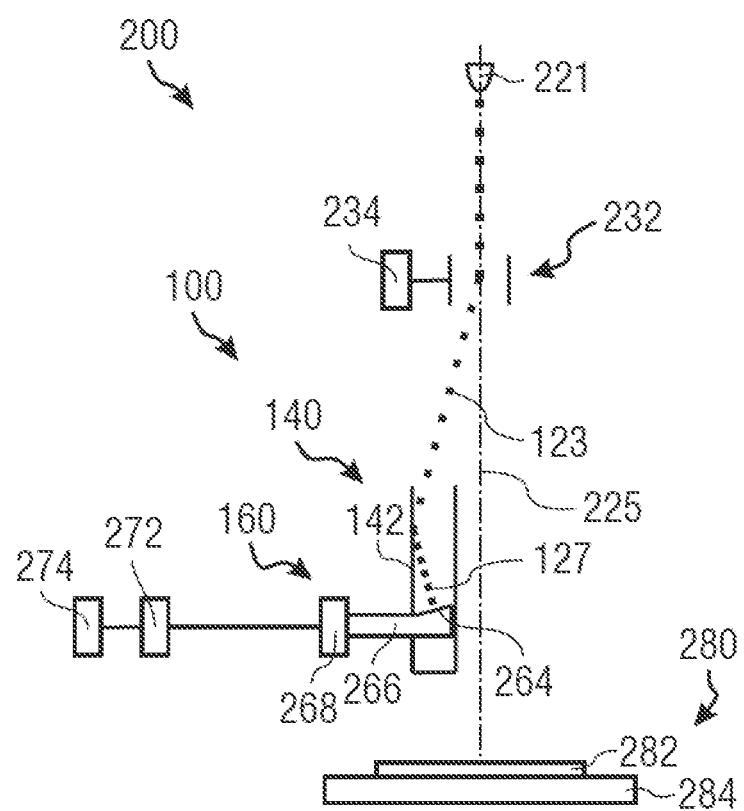
FIG. 2 is a schematic drawing illustrating a charged particle beam device and a current measurement module according to embodiments described herein.

FIG. 2 shows a current measurement module 100 and a charged particle beam device 200 according to embodiments described herein. In FIG. 2, elements corresponding to elements of FIG. 1 have the same reference sign, and the description of FIG. 1 is also applicable to FIG. 2 and vice versa.

According to an embodiment shown in FIG. 2, a charged particle beam device 200 may be provided. According to an embodiment shown in FIG. 2, a charged particle source 221 configured to emit the primary charged particle beam 123 may be provided. According to an embodiment shown in FIG. 2, the charged particle source 221 may be a cold field emitter, for example, a cold field emitter configured to emit an electron beam.

According to an embodiment shown in FIG. 2, a beam guiding module 232 is provided. According to embodiments, the beam guiding module 232 is configured to deflect the primary charged particle beam 123 to the beam dump 140. For example, the beam guiding module 232 may be a deflector unit.

Accordingly, during a time when the primary charged particle beam 123 is to be blanked, the primary charged particle beam 123 may be quickly deflected into the beam dump 140. Accordingly, on impingement of the primary charged particle beam 123 on a conductive surface 142 of the beam dump, secondary and/or backscattered charged particles 127 are released and detected by the detection unit 160.

Beneficially, the switch-over to current measurement mode is very fast. Current measurement can be performed much more frequently.

According to an embodiment shown in FIG. 2, the current measurement module 100 includes a scintillation element 264, a light guide 266, and a photodetector 268. According to embodiments, the scintillation element 264 is arranged within the beam dump 140. According to embodiments, the light guide 266 is configured for guiding photons away from the primary charged particle beam 123.

According to embodiments, the scintillation element 264 may be arranged in the beam dump 140. According to some embodiments, which can be combined with other embodiments described herein, the magnitude of the detected secondary and/or backscattered charged particles 127 may be associated directly with the current of the primary charged particle beam 123. Beneficially, the accuracy of the measurement is improved. For example, by arranging the scintillation element 264 within the beam dump 140, the measurement is associated directly with the current of the primary charged particle beam 123.

Figure 3:
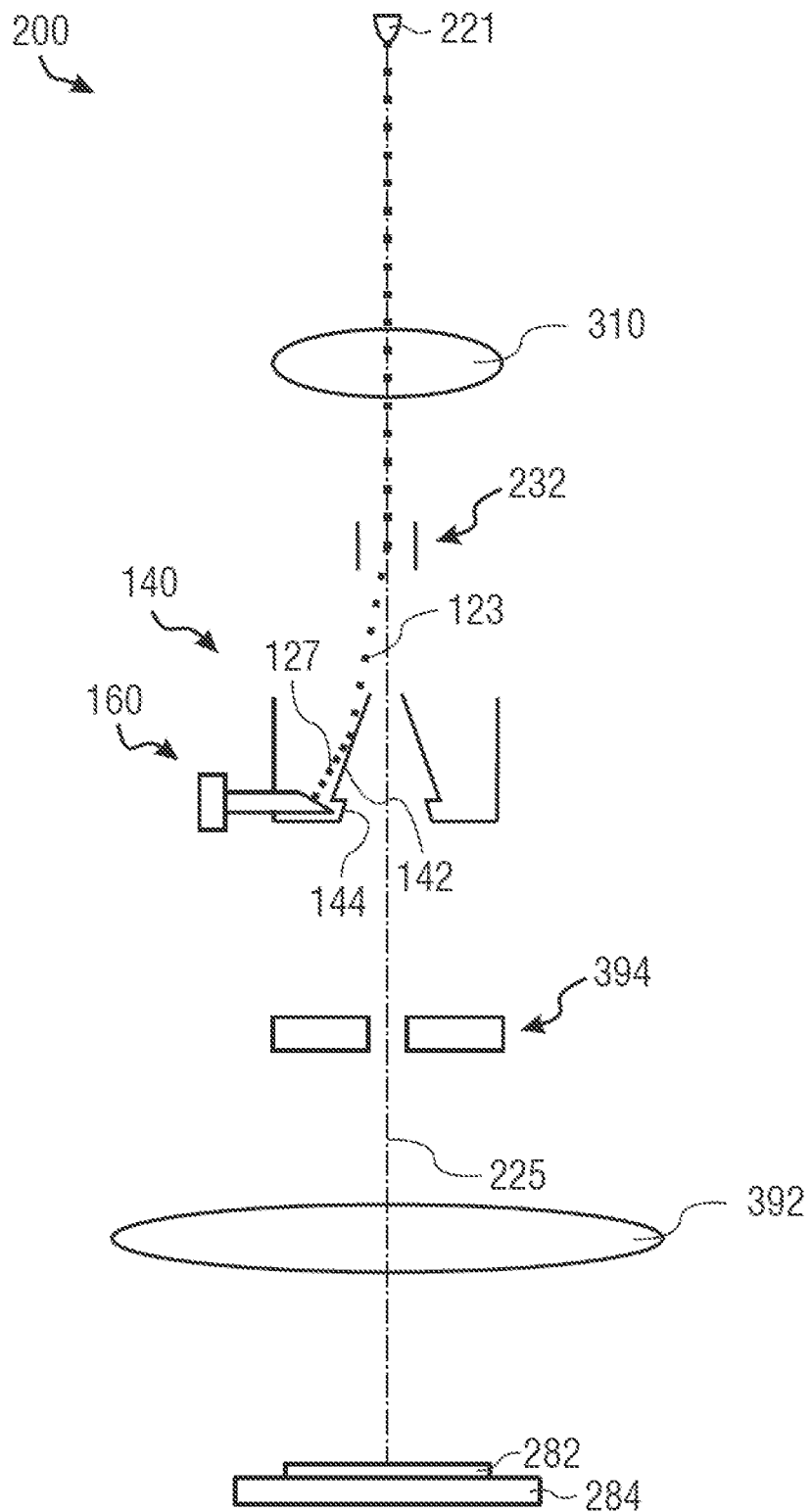
FIG. 3 is a schematic drawing illustrating a charged particle beam device according to embodiments described herein.

FIG. 3 shows a charged particle beam device according to embodiments described herein. In FIG. 3, elements corresponding to elements of FIG. 1 and FIG. 2 have the same reference sign, and the descriptions of FIG. 1 and FIG. 2 are also applicable to FIG. 3 and vice versa.

According to embodiments, the scintillation element 264 may arranged in a recess 144 in a conductive surface 142 of the beam dump 140. Beneficially, space is used efficiently, such as the space proximate to the primary charged particle beam. According to some embodiments, which can be combined with other embodiments described herein, the current measurement module can be electrically insulated. For example, by using the scintillation element 264 and the light guide 266, the current measurement module 100 can be electrically insulated even when the beam dump 140 is at a high voltage.

According to an embodiment shown in FIG. 3, a charged particle beam device 200 may be provided. According to an embodiment shown in FIG. 3, the charged particle beam device may include at least one of: a charged particle source 221, a condenser lens 310, a beam guiding module 232, a beam dump 140, a detection unit 160, an objective lens 392, a specimen support 284, and a secondary charged particle signal detector 394.

According to embodiments, the primary charged particle beam 123 may impinge on a specimen 282 to generate a secondary charged particle signal (not shown). The secondary charged particle signal detector 394 may be used and/or configured for detecting the secondary charged particle signal.

According to embodiments, the beam dump 140 may include a recess 144. According to embodiments, the recess 144 may be configured for accommodating a portion of the detection unit 160, e.g. a portion of the scintillation element 264.

According to some embodiments, which can be combined with other embodiments described herein, (the scintillation element 264 of) the detection unit 160 may be arranged at least partially in the recess 144 of the beam dump 140 for detecting the secondary and/or backscattered charged particles 127 released upon impingement of the primary charged particle beam 123 on the conductive surface 142 of the beam dump 140. Beneficially, an arrangement of (the scintillation element 264 of) the detection unit 160 is configured for optimal detection of the secondary and/or backscattered charged particles 127 released (from the conductive surface 142).

FIG. 4 shows a method of measuring a current of a primary charged particle beam. According to embodiments, the method includes detecting secondary and/or backscattered charged particles released upon impingement of the primary charged particle beam on a conductive surface of a beam dump of the charged particle beam device as illustrated in operation 400.

According to embodiments, the secondary and/or backscattered charged particles released upon impingement of the primary charged particle beam on a conductive surface of a beam dump of the charged particle beam device is detected as illustrated in operation 400 during a time period when the primary charged particle beam is to be blanked and/or during a time when the primary charged particle beam is to impinge upon a location other than a specimen location.

According to some embodiments, which can be combined with other embodiments described herein, the measurement of the current of the primary beam is performed during a time when the primary charged particle beam is to be blanked or dumped. For example, by detecting the secondary charged released upon impingement of the primary charged particle beam on the conductive surface of the beam dump as illustrated in operation 400, the current of the primary charged particle beam can be determined and/or monitored without requiring dedicated maintenance time. Beneficially, fundamental shortcomings of cold field emission such as probe current noise, jump, and drifts, which impact grey level matching and precision and which cannot be solved by solutions such as vacuum and tip processing, can be effectively addressed. Beneficially, probe current fluctuations can be monitored online, e.g. during blanking times and/or between frames or lines, e.g. by using probe current reading as feedback for grey level correction.

FIG. 5 shows a method of measuring a current of a primary charged particle beam including a number of embodiments.

According to an embodiment shown in FIG. 5, the method includes determining a value indicative of the current of the primary charged particle beam based on a magnitude of the detected secondary and/or backscattered charged particles as illustrated in operation 550. Accordingly, an adjustment can be made based on the detected secondary and/or backscattered charged particles as illustrated in operation 560. For example, an adjustment of a grey level of a secondary charged particle signal can be made based on the determined value indicative of the current of the primary charged particle beam.

Next, individual aspects of an apparatus of the embodiments are described in more detail. Each of these aspects is optional and can be combined with any embodiment or other aspect disclosed herein, unless specified otherwise.

Current Measurement Module

According to embodiments, the current measurement module includes a detection unit 160. A charged particle beam device providing the primary charged particle beam 123 may include a Faraday cup in the vicinity of the specimen location 280, e.g. specimen support 284. Such a Faraday cup typically has to be moved in and out of the way of the working area, e.g. measuring area or of the primary charged particle beam 123.

According to embodiments, the beam current measurement of the primary charged particle beam is conducted during changing of the specimen 282, during a time period during which the beam is blanked (e.g. 0 ms to 3 s), and/or during small non-imaging periods of less than about 5 s (e.g., change of specimen 282).

Beam Dump

According to embodiments, there is provided a beam dump 140. According to embodiments, the beam dump 140 includes a conductive surface 142. According to embodiments, the secondary and/or backscattered particles 127 are released on impingement of the primary charged particle beam 123 on the conductive surface 142 of the beam dump 140.

According to embodiments, the beam dump 140 is of a charged particle beam device 200. According to embodiments, the conductive surface 142 of the beam dump 140 is arranged to be impinged by the primary charged particle beam at an angle less than 45 degrees, less than 30 degrees or less than 15 degrees relative to the conductive surface 142 of the beam dump 140. Beneficially, the conversion efficiency of the primary beam to secondary charged particles, e.g. backscattered electrons, may be improved. Alternatively, as the deflection of the beam is rather small, the conductive surface 142 of the beam dump 140 may be arranged to be impinged by the primary charged particle beam at an angle less than 45 degrees, less than 30 degrees or less than 15 degrees relative to the axis 225 of charged particle beam device 200.

Detection Unit

According to embodiments, there is provided a detection unit 160. According to embodiments, the detection unit 160 is configured for detecting secondary and/or backscattered particles 127. According to embodiments, the detection unit 160 includes a scintillator, e.g. scintillation element 264, a light guide 266, and a photodetector 268. In an example, the photodetector 268 is a photomultiplier tube.

According to embodiments, the detection unit 160 is configured to be impinged by secondary and/or backscattered particles 127. For example, the scintillation element 264 of the detection unit 160 is arranged to be impinged by secondary and/or backscattered particles 127 released on impingement of the primary charged particle beam 123 on the conductive surface 142 of the beam dump 140.

According to embodiments, the scintillation element 264 of the detection unit 160 is configured to convert secondary and/or backscattered particles 127 to photons. According to embodiments, the scintillation element 264 is arranged within the beam dump 140. According to embodiments, the scintillation element 264 is arranged at an angle (substantially) perpendicular to a propagation direction of the secondary and/or backscattered particles 127.

Beneficially, by receiving the primary charged particle beam 123 within the beam dump 140 for the measurement of the current of the primary charged particle beam 123, unwanted scattering, generation and the like of charged particles may be suitably contained. In an example, the amount of secondary and/or backscattered charged particles leaking out of the beam dump 140 is less than 1%.

According to embodiments, the light guide 266 is configured to guide photons generated by the scintillation element 264 to the photodetector 268. According to embodiments, the light guide 266 is attached at a first end portion to the scintillation element 264. According to embodiments, the light guide 266 is attached at a second end portion to the photodetector 268.

In an example, the light guide 266 is configured to guide the photons from the beam dump 140. In an example, the light guide 266 is configured to guide the photons away from the beam dump. In an example, the light guide 266 is configured to guide the photons away from the axis 225 of the charged particle beam device 200.

In an example, the light guide 266 is configured to guide the photons away from the primary charged particle beam 123. In an example, the light guide 266 is configured to guide the photons to a photomultiplier tube.

The term 'away' may be understood as a direction where the component perpendicular to and away from a reference is the dominant component. In an example, the reference is the primary charged particle beam 123 or the axis 225 of the charged particle beam device 200.

According to embodiments, the photodetector 268 is a photomultiplier tube or a photodiode. According to embodiments, the photodetector 268 is configured to convert the photons into an electrical signal. According to embodiments, a magnitude of the electrical signal is indicative of (e.g. correlated or proportional to) a magnitude of at least one of the following: the photons, the secondary and/or backscattered particles 127, and/or the primary charged particle beam 123.

According to embodiments, the detection unit 160, e.g. the photodetector 268, is configured to be in communication with a current determination unit 272. According to embodiments, the detection unit 160, e.g. the photodetector 268, is configured to provide a signal to the current determination unit 272. According to embodiments, the signal is the electrical signal produced by the photodetector 268 or based on the electrical signal produced by the photodetector 268. According to embodiments, the signal is indicative of a magnitude of the detected secondary and/or backscattered charged particles 127.

Beneficially, switching between an imaging mode, e.g. which the primary charged particle beam is guided onto the specimen, and a mode for which the primary charged particle beam is directed to the beam dump 140 for dumping the primary charged particle beam 123 and/or for detecting secondary and/or backscattered particles 127, can be conducted very fast. Beneficially, the current of the primary charged particle beam 123 can be more often verified and/or adjusted.

It may be understood that a PIN-diode detector (not shown) may be used (instead of a scintillator). According to embodiments, a PIN-diode detector may be configured to (directly) convert the secondary and/or backscattered charged particles 127 into an/a (electrical) signal. According to embodiments, the signal is indicative of a magnitude of the detected secondary and/or backscattered charged particles 127.

It may be understood that a scintillator is especially beneficial when the beam dump is floating on high voltage. However, a PIN-diode detector may also be used in place of a scintillator.

Current Determination Unit

According to embodiments, a current determination unit 272 may be provided. According to embodiments, the current determination unit 272 may be in communication with the detection unit 160, e.g. the photodetector 268. According to embodiments, the current determination unit 272 may be configured to receive a signal from the detection unit 160, e.g. the photodetector 268. According to embodiments, the current determination unit 272 may be configured to receive a signal indicative of a magnitude of the detected secondary and/or backscattered charged particles 127.

According to embodiments, the current determination unit 272 may be configured to receive a signal indicative of a magnitude of the detected secondary and/or backscattered charged particles 127 from the detection unit 160, e.g. the photodetector 268.

Beneficially, embodiments described herein may be employed to improve the current stability of many charge particle beam applications, in particular quantitative measurements in general, CD measurements and EDX measurements. Many applications call for an accuracy of the charged particle beam current of 1% or less. Thus, a frequent verification and/or adaptation of the beam current are beneficial.

The embodiments described herein can provide a fast and frequent beam current measurement. For example, according to some embodiments, a beam current measurement and a corresponding recalibration might be conducted at intervals as little as several tens of seconds (e.g. every 30 to 100 seconds), or even at intervals of several seconds (e.g. every 3 to 10 seconds), or even at intervals of a fraction of a second (e.g., 30 to 100 milliseconds).

According to embodiments, a value indicative of a current of the primary charged particle beam 123 may be used to compensate for a fluctuation or jump in the current of the primary charged particle beam 123. Beneficially, a jump or variation of the beam current, which might be introduced during flashing process of a cold field emitter (CFE) or due to atom adsorption on the CFE surface, is compensated. According to embodiments, a compensation may be conducted by adjusting an extractor voltage, a suppressor voltage, an anode voltage, an emitter tip voltage and/or other methods.

According to embodiments, a current determination memory 274 may be provided. According to embodiments, the current determination memory 274 is configured for storing data for calibration of a value indicative of a current of the primary charged particle beam 123. According to embodiments, the current determination unit 272 may be in communication with the current determination memory 274. According to embodiments, the current determination unit 272 may comprise the current determination memory 274.

Faraday Cup-Electrometer

According to embodiments, calibration of the detection unit 160 may be provided. According to embodiments, the current determination unit 272 may be in communication with an electrometer. According to embodiments, the electrometer may be configured to measure the current of the primary charged particle beam 123. According to embodiments, the electrometer may be connected to a Faraday cup. According to embodiments, the Faraday cup may be configured to be impinge-able by the primary charged particle beam 123.

According to embodiments, for conducting a calibration of the value indicative of the current of the primary charged particle beam 123 determined by the current determination unit 272, the current determination unit 272 may be in communication with a Faraday-cup-electrometer arrangement. According to embodiments, the Faraday cup-electrometer-arrangement may be provided in a charged particle beam device 200.

According to embodiments, a value indicative of the current of the primary charged particle beam 123 determined by the current determination unit 272 may be compared to a value of the current of the primary charged particle beam 123 obtained with an electrometer (connected to a Faraday cup). A value indicative of the current of the primary charged particle beam 123 determined by the current determination unit 272 can be calibrated to a value of the current of the primary charged particle beam 123 determined by the electrometer (connected to the Faraday cup).

According to embodiments, different beam currents may be generated during calibration, such that a calibration curve (e.g. a linear calibration curve) for the current of the primary charged particle beam 123 as a function of the value indicative of the current of the primary charged particle beam 123 determined by the current determination unit 272 may be realized.

According to embodiments, calibration of the value indicative of the current of the primary charged particle beam 123 determined by the current determination unit 272 may be conducted at a regular or non-regular interval, e.g. at regular intervals of 24 hours, at regular intervals such as regular scheduled maintenance, non-regular intervals such as during maintenance, or at other time intervals in order to avoid a drift of the measurement of the current of the primary charged particle beam.

Charged Particle Beam Device

According to embodiments, there is provided a charged particle beam device 200. According to embodiments, a charged particle source 221 for emitting a primary charged particle beam 123 is provided. According to embodiments, the charged particle beam device 200 has an axis 225. According to embodiments, the primary charged particle beam 123 is guided along the axis 225.

According to embodiments, the charged particle source 221 is of a cold field emission type, e.g. a cold field emitter. In an example, the primary charged particle beam 123 is emitted by a cold field emitter (CFE). It may be understood that fluctuations of the current of the primary charged particle beam (emission noise) may be due to residual gases contaminating the surface of the emitter. Beneficially, the current of the primary charged particle beam which can experience an upward or downward jump in primary beam current of up to 10% after a flashing (cleaning) process and/or due to the contamination of the surface of the emitter (e.g. adsorption of atoms/molecules on the emitter surface) can be regularly measured and compensated.

According to embodiments, the charged particle source 221 is of a thermal field emitter type, e.g. a thermal field emitter. In an example, the primary charged particle beam 123 is emitted by a thermal field emitter (TFE). Accordingly, while the current fluctuations of a thermal field emitter are typically smaller than the current fluctuations of a cold field emitter, the embodiments described herein are also beneficial for thermal field emitters.

According to embodiments, the charged particle source 221 is of a cold field emission type or thermal field emitter type, or is a cold field emitter or a thermal field emitter.

According to embodiments, the primary charged particle beam 123 is guided towards a specimen location 280. According to embodiments, there is provided a specimen support 284 for supporting a specimen 282, e.g. at a specimen location 280. According to embodiments, the primary charged particle beam 123 is focused on a specimen 282 by an objective lens.

According to embodiments, impingement of the primary charged particle beam 123 on the specimen 282 results in a secondary and/or backscattered signal. According to embodiments, the secondary and/or backscattered signal are guided towards a sensor unit. According to embodiments, the sensor unit generates a signal on impingement of the secondary and/or backscattered signal, which is used for image generation during normal operation of the charged particle beam device 200.

Beam Guiding Module

According to embodiments, there is provided a beam guiding module 232. According to embodiments, the beam guiding module 232 is configured to deflect the primary charged particle beam 123 to at least the beam dump 140. For example, the beam guiding module 232 is configured to deflect the primary charged particle beam 123 into the beam dump 140.

In an example, the beam guiding module 232 is configured to deflect the primary charged particle beam 123 to impinge on a conductive surface 142 of the beam dump 140. Beneficially, the current of the primary charged particle beam 123 can be measured.

According to embodiments, the beam guiding module 232 is configured to deflect the primary charged particle beam 123 to a specimen location 280. According to embodiments, the beam guiding module 232 is configured to deflect the primary charged particle beam 123 to the beam dump 140 and a specimen location 280 individually.

According to embodiments, the beam guiding module 232 is arranged between the charged particle source 221 and the detection unit 160. According to embodiments, the beam guiding module 232 includes an electrode element having an opening for a trespassing of the primary charged particle beam 123, e.g. during an imaging operation. According to embodiments, the beam guiding module 232 includes at least one electrostatic, magnetic or combined electrostatic-magnetic deflection unit.

According to embodiments, the beam guiding module 232 includes a voltage supply unit configured to bias the electrode element. According to embodiments, the electrode element of the beam guiding module 232 is configured to deflect the primary charged particle beam 123 to (a conductive surface 142 of) the beam dump 140.

According to embodiments, a storing element 234 is provided to store the control values for the beam guiding module 232 with which the primary charged particle beam is guided to the beam dump 140 for measuring the primary beam current. According to embodiments, further control values for the beam guiding module 232 with which the primary charged particle beam 123 may be guided may be stored in the storing element 234. Typically, the control values can be voltages and/or currents which correspond to the guiding (e.g. deflection).

Measuring a Current of a Primary Charged Particle Beam

According to embodiments, a method of measuring a current of a primary charged particle beam includes detecting secondary and/or backscattered charged particles as illustrated in operation 400. According to embodiments, the secondary and/or backscattered charged particles are released upon impingement of the primary charged particle beam on a conductive surface of a beam dump of the charged particle beam device.

According to embodiments, the method includes deflecting the primary charged particle beam to the conductive surface of the beam dump of the charged particle beam device as illustrated in operation 510. According to embodiments, the primary charged particle beam is deflected to the conductive surface of the beam dump of the charged particle beam device as illustrated in operation 510 at an angle less than 45 degrees, less than 30 degrees, or less than 15 degrees relative to the conductive surface of the beam dump. Beneficially, conversion efficiency of the primary charged particle beam into secondary and/or backscattered charged particles is improved at the angles described in embodiments herein. The angle of the primary charged particle beam relative to the conductive surface of the beam dump may be understood as an incident angle.

In an example, detecting secondary and/or backscattered charged particles released upon impingement of the primary charged particle beam on the conductive surface of the beam dump of the charged particle beam device as illustrated in operation 400 includes one or more of converting the released secondary and/or backscattered charged particles into photons as illustrated in operation 520, guiding photons converted from the released secondary and/or backscattered charged particles away from the primary charged particle beam as illustrated in operation 530, and converting photons derived from the released secondary and/or backscattered charged particles into an electrical signal having a value indicative of a magnitude of the detected secondary and/or backscattered charged particles as illustrated in operation 540.

It may be understood that detecting secondary and/or backscattered charged particles released upon impingement of the primary charged particle beam on the conductive surface of the beam dump may include the use of other types of sensors for measuring a magnitude of the secondary and/or backscattered charged particles.

According to embodiments, the method includes determining a value indicative of the current of the primary charged particle beam based on (an electrical signal indicative of) a magnitude of the detected secondary and/or backscattered charged particles as illustrated in operation 550.

According to embodiments, the method includes making an adjustment based on the detected secondary and/or backscattered charged particles as illustrated in operation 560.

In an example, making the adjustment as illustrated in operation 560 includes one or more of a group comprising: (a) adjusting a grey level of a secondary charged particle signal, (b) changing a grey level of a secondary charged particle signal in a direction opposite of a change in the detected secondary and/or backscattered charged particles, (c) changing a grey level of a secondary charged particle signal proportionally with a change in the detected secondary and/or backscattered charged particles, (d) adjusting the current of the primary charged particle beam, and (e) adjusting based on a value indicative of the current of the primary charged particle beam, the value indicative of the current of the primary charged particle beam being determined based on the detected secondary and/or backscattered charged particles.

In an example, making the adjustment as illustrated in operation 560 (e.g. adjusting the current of the primary charged particle beam) includes at least one of adjusting an extractor voltage, a suppressor voltage, an anode voltage and an emitter tip voltage.

In an example, the secondary and/or backscattered charged particles released upon impingement of the primary charged particle beam on a conductive surface of a beam dump of the charged particle beam device is detected as illustrated in operation 400 during a time period when the primary charged particle beam is to be blanked and/or during a time when the primary charged particle beam is to impinge upon a location other than a specimen location.

It may be understood that any one or any plurality of the operations according to embodiments described herein may be combined appropriately, in an order as shown in FIG. 5 or in a different order.

Embodiments are also directed to apparatuses for carrying out the disclosed methods and including apparatus parts for performing each described method step. These method steps may be performed by way of hardware components, a computer programmed by appropriate software, by any combination of the two or in any other manner.

Furthermore, embodiments are also directed to methods by which the described apparatus operates. It includes method steps for carrying out each function of the apparatus or manufacturing each part of the apparatus.

While the foregoing is directed to embodiments of the invention, other and further embodiments of the invention may be devised without departing from the scope thereof, and the scope thereof is determined by the claims that follow.

The invention claimed is:

1. A current measurement module for measuring a current of a primary charged particle beam of a charged particle beam device, the current measurement module comprising:
    a detection unit configured for detecting secondary and/or backscattered charged particles released on impingement of the primary charged particle beam on a conductive surface of a beam dump of the charged particle beam device.

2. The current measurement module according to claim 1, wherein the detection unit comprises a scintillation element arranged within the beam dump.

3. The current measurement module according to claim 2, wherein the detection unit comprises a light guide configured for guiding photons generated by the scintillation element to a photodetector.

4. The current measurement module according to claim 3, wherein the light guide is configured for guiding the photons away from the primary charged particle beam.

5. The current measurement module according to claim 1, wherein the detection unit is configured according to be in communication with a current determination unit and to provide a signal to the current determination unit, wherein the signal is based on the detected secondary and/or backscattered particles, and wherein the signal is indicative of at least one of a magnitude of the detected secondary and/or backscattered charged particles and a magnitude of the current of the primary charged particle beam.

6. The current measurement module according to claim 1, wherein the conductive surface of the beam dump is arranged to be impinged by the primary charged particle beam at an angle less than 45 degrees or less than 30 degrees relative to the conductive surface of the beam dump.

7. A charged particle beam device comprising:
    the current measurement module according to claim 1; and
    a beam guiding module configured to deflect the primary charged particle beam to the beam dump and a specimen location individually.

8. A method of measuring a current of a primary charged particle beam of a charged particle beam device, the method comprising:
    detecting secondary and/or backscattered charged particles released upon impingement of the primary charged particle beam on a conductive surface of a beam dump of the charged particle beam device.

9. The method according to claim 8, further comprising:
    deflecting the primary charged particle beam to the conductive surface of the beam dump of the charged particle beam device.

10. The method according to claim 9, wherein the primary charged particle beam is deflected to the conductive surface of the beam dump of the charged particle beam device at an angle less than 45 degrees or less than 30 degrees relative to the conductive surface of the beam dump.

11. The method according to claim 8, wherein detecting secondary and/or backscattered charged particles released upon impingement of the primary charged particle beam on the conductive surface of the beam dump of the charged particle beam device comprises at least one of the following:
    converting the released secondary and/or backscattered charged particles into photons,
    guiding photons converted from the released secondary and/or backscattered charged particles away from the primary charged particle beam, and
    converting photons derived from the released secondary and/or backscattered charged particles into an electrical signal having a value indicative of a magnitude of the detected secondary and/or backscattered charged particles.

12. The method according to claim 8, further comprising:
    determining a value indicative of the current of the primary charged particle beam based on a magnitude of the detected secondary and/or backscattered charged particles.

13. The method according to claim 8, further comprising:
    making an adjustment based on the detected secondary and/or backscattered charged particles.

14. The method according to claim 13, wherein making the adjustment comprises at least one of the following:
- adjusting a grey level of a secondary charged particle signal,
- changing a grey level of a secondary charged particle signal in a direction opposite of a change in the detected secondary and/or backscattered charged particles,
- changing a grey level of a secondary charged particle signal proportionally with a change in the detected secondary and/or backscattered charged particles,
- adjusting the current of the primary charged particle beam, and
- adjusting based on a value indicative of the current of the primary charged particle beam, the value indicative of the current of the primary charged particle beam being determined based on the detected secondary and/or backscattered charged particles.

15. The method according to claim 8, wherein the secondary and/or backscattered charged particles released upon impingement of the primary charged particle beam on the conductive surface of the beam dump of the charged particle beam device is detected during a time period when the primary charged particle beam is to be blanked and/or during a time when the primary charged particle beam is to impinge upon a location other than a specimen location.

* * * * *